United States Patent
Reynolds

(10) Patent No.: US 8,279,626 B2
(45) Date of Patent: Oct. 2, 2012

(54) ADD-ON POWER METER ASSEMBLY FOR ELECTRICAL POWER RACEWAY

(75) Inventor: Charles Reynolds, San Jose, CA (US)

(73) Assignee: Cyberswitchingpatents, LLC., San Jose, CA (US)

(*) Notice: Subject to any disclaimer, the term of this patent is extended or adjusted under 35 U.S.C. 154(b) by 254 days.

(21) Appl. No.: 12/887,506

(22) Filed: Sep. 22, 2010

(65) Prior Publication Data

US 2012/0069495 A1   Mar. 22, 2012

(51) Int. Cl.
  *H02B 1/20* (2006.01)
  *H02B 1/26* (2006.01)
  *H02G 3/08* (2006.01)
(52) U.S. Cl. .................... 361/826; 174/481; 361/641
(58) Field of Classification Search .................. 361/642, 361/659, 822–824, 826, 835
  See application file for complete search history.

(56) References Cited

U.S. PATENT DOCUMENTS

| | | | | | |
|---|---|---|---|---|---|
| 3,721,762 | A | * | 3/1973 | Gooding | 174/504 |
| 4,702,768 | A | * | 10/1987 | Areauz et al. | 75/382 |
| 5,844,763 | A | * | 12/1998 | Grace et al. | 361/111 |
| 7,009,108 | B2 | * | 3/2006 | Vargas et al. | 174/530 |
| 7,116,550 | B2 | * | 10/2006 | Ewing et al. | 361/623 |
| 7,201,589 | B2 | * | 4/2007 | Jong | 439/94 |

\* cited by examiner

*Primary Examiner* — Gregory Thompson
(74) *Attorney, Agent, or Firm* — Michael W. Caldwell

(57) ABSTRACT

A power meter assembly for enclosure within an electrical wiring raceway comprises a power meter affixed to a mounting plate. The mounting plate is of an arbitrary width down the length of the raceway. The mounting plate includes tabs for attachment to the raceway, facing away from the user, towards the raceway opening. The power meter provides typical electrical power information for viewing by a user, and may include buttons or other mechanisms to enable the user to select a desired data presentation.

4 Claims, 3 Drawing Sheets

SECTION A-A

ADD-ON POWER METER ASSEMBLY FOR ELECTRICAL POWER RACEWAY

BACKGROUND

The power distribution and monitoring industries provide a tremendous variety of mechanical and electrical products. Home construction is generally regulated by federal, state, and local building codes, as well as consumers' needs for standardization, thereby motivating manufacturers to provide products meeting real and defacto standards. This availability of electrical products meeting standards, especially mechanical standards, provides convenience for consumers in that they may select from a variety of products for new and retrofit purposes.

Standardization is less rigorous for the installation of the electrical infrastructure in commercial and industrial locations. Certainly building codes specify certain requirements that provide for safety during and after installation, and many components used in a commercial installation are also used in a residence, such as a standard power outlet. But a variety of non-standardized products and materials are available to the architect and installer of a building's electrical system. An example of a product often used for routing electrical wires from a junction box to a point of use location is a wiring raceway. A three-sided raceway is typically mounted against a wall, a four-sided raceway is often used in a free-standing laboratory or assembly area where all sides may be exposed. An important characteristic of such installations is that each is customized, often determined by an electrician on the spot at the time of installation.

The most common components made available to users as-installed in a raceway are electrical outlets. Depending upon code restrictions and safety considerations, CAT5 wire for a local area network, coax cable for carrying video signals, even high pressure air may also be encased in a raceway, with the appropriate termination placed where it will be convenient for users. However needs may change over time, and therefore the complement of components encased in a raceway may need to be changed in response.

Power monitoring is sometimes provided for an entire building or subset of the building, for example a circuit or collection of circuits dedicated to a certain section of a building. However there are circumstances in which it is desirable to monitor the power or power use corresponding to a smaller region, for example an area served by a single raceway. It would be desirable to install a power. It would also be desirable to retrofit a power meter into a raceway in response to a change in need or simply a decision. However power meters for encasement in a raceway to meter single outlets or single circuits are not available today.

SUMMARY

Applicant's invention comprises a power meter mounted on a plate, whereby the power meter and plate assembly may be conveniently mounted within a raceway during assembly of the raceway. Additionally, the invention provides for retrofitting a power meter after complete installation of a raceway. Installing a power meter mechanically further requires connecting the power meter in a certain way such that the power meter will correctly report the data taken.

DETAILED DESCRIPTION OF THE INVENTION

Figure 1:
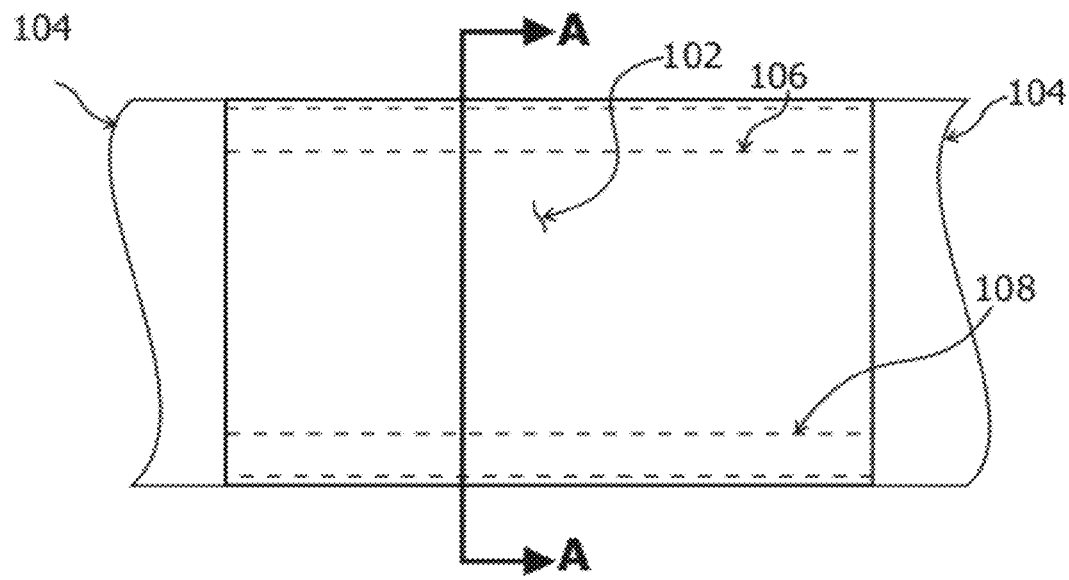
FIG. 1 is an example of a plate for mounting a power meter to a raceway.
Figure 2:
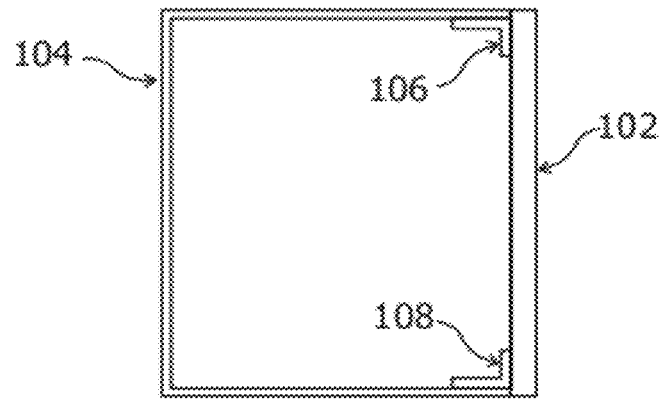
FIG. 2 is a cross section of the plate shown in FIG. 1 with two optional mounting methods shown.

Referring to FIG. 1 and FIG. 2, an example of a raceway 104 is shown as a channel, enclosed on three sides. Raceways are available from a variety of makers, for example Legrand® 6000® Series Steel Raceway, available from Wiremold, 60 Woodlawn Street, West Hartford, Conn., 06110. Though each maker will have some differences, in general a steel raceway is approximately 4.75 inches in high and 3.5 inches deep. These dimensions will vary, depending upon a specific use. The dimensions of a specific raceway do not matter in the practice of the invention, provided the opening and depth sizes are adequate to hold a power meter.

A plate 102 can be made of an arbitrary width. "Width" as viewed in FIG. 1 is the dimension along the raceway (in the direction of wire routing) and is immaterial here except for convenience in referring to directions. The height (again, as viewed I FIG. 1) is approximately the same as that of the raceway 104, depending upon the mechanism used to attach the plate 102 to the raceway 104. In FIG. 1 and FIG. 2 are exemplary angle pieces 106, 108 which are affixed to the plate 102 back by a variety of means, for example rivets, screws, and adhesives (not shown). The angled pieces 106, 108 are then affixed to the raceway 104 after insertion of the plate 102 plus angles 106, 108 after assembly into the raceway 104, by friction, adhesive, screws, or interference fit (not shown).

In some embodiments of the present invention the angles 106 and 108 are eliminated by roll forming the plate 102 with lips on the inside, facing the raceway 104. The lips are in the positions shown for the angled pieces 106, 108. The rolled lips may simply be flat and affixed to the raceway 104 with rivets, screws, or adhesive. In one embodiment the lips are slightly farther apart than the opening of the raceway and springy, thereby providing friction that holds the assembly (plate 102 plus power meter 300) in the raceway 104, which also allows for convenient removal.

As is seen, then, a plate 102 of an arbitrary width may be inserted into the raceway 104, for the purpose of attaching a component to the raceway assembly. For example, Wiremold and others offer a catalog of plates 102 with openings for power outlets of various sizes and shapes. According to the present invention, a power meter 300 is provided a plate 102 with an opening such that the power meter 300 may be affixed to the plate 102 by screws, adhesives, standoffs, and the like. An example of a suitable power meter is a model 2001-CSXH Prodigit power monitor module, available from Prodigit Electronics Co., Ltd. Prodigit may be reach by phone at 886-2-29182620 or via the internet URL www.prodigt.com.

Figure 3:
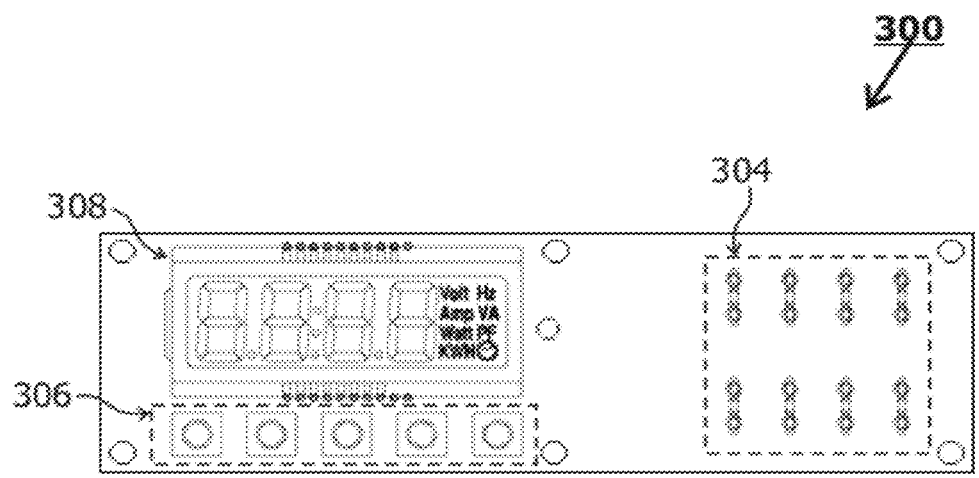
FIG. 3 is an example of a power meter for mounting on a plate.
Figure 4:
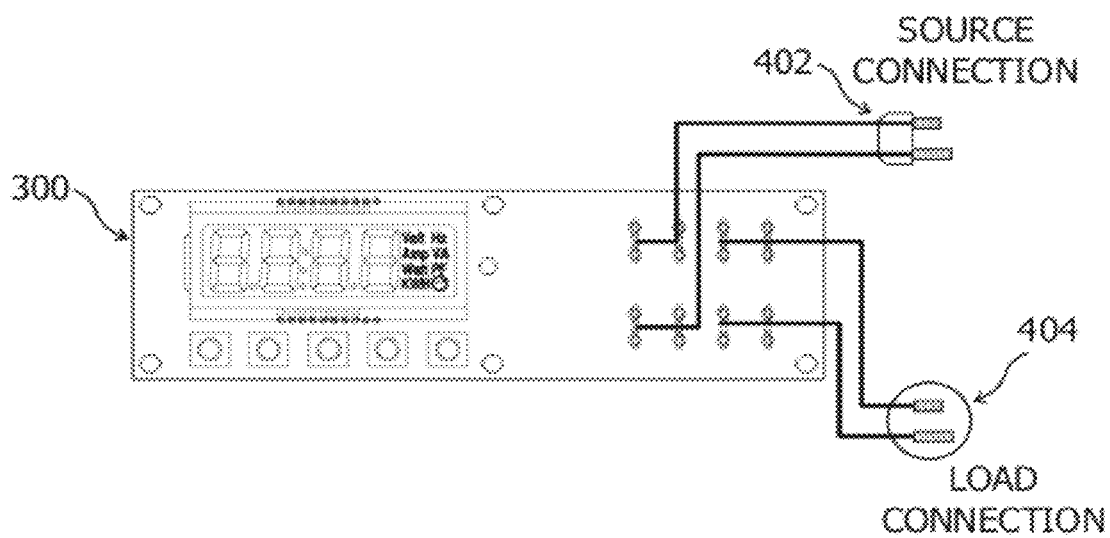
FIG. 4 is an example of a method for mounting a power meter to a plate.

In the example shown in FIG. 3, the power meter comprises electrical connections 304 on the side of the power meter that is away from the user. Buttons 306 allow the user to set options for display in a display component 308. The display component 308 may be an LCD or an LED multi-segment display, or any other display which will present alphanumeric information to the viewer. Other power meters from this or other makers may have more or fewer features for interface to the user. Data typically presented by the power meter includes instant voltage, current, frequency, wattage, kilowatt hours, and power factor. Some power meters present more or fewer data types.

Figure 5:
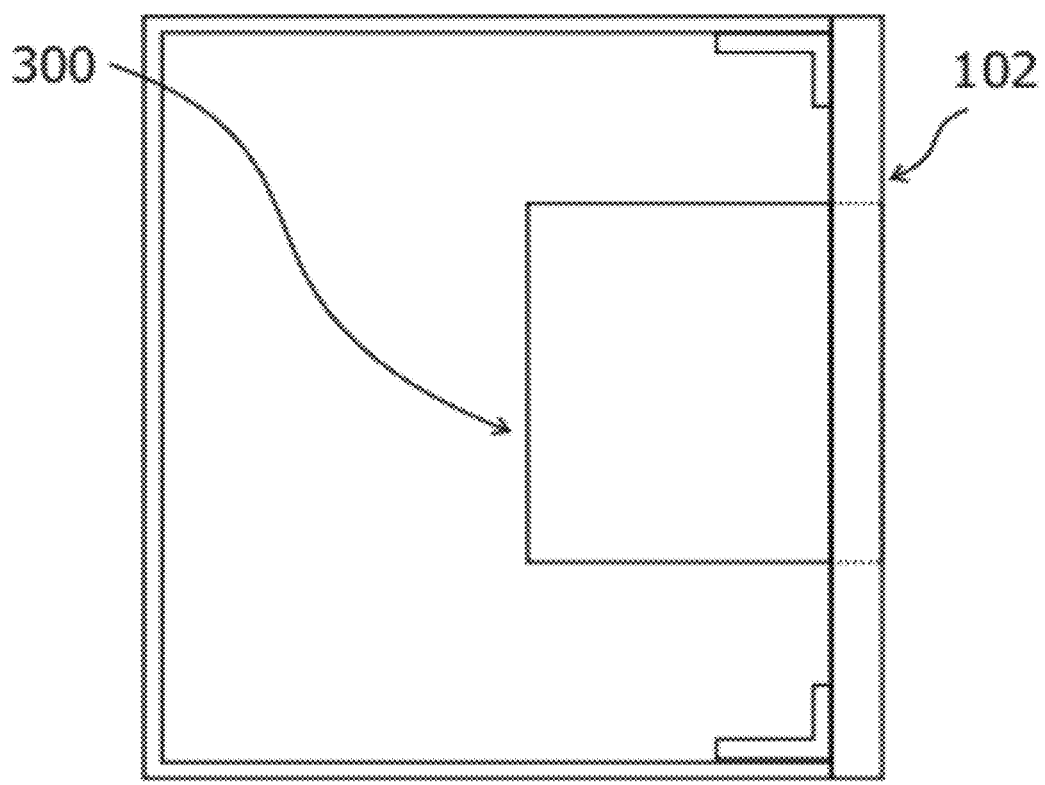
FIG. 5 is a schematic for the electrical connection of a power meter between and across a power source and a load.

An assembly, as shown in FIG. 5, comprises a power meter 300 permanently affixed to a plate 102. The power meter 300 must be connected to a source of electricity at an input terminal 402 and to a terminal 404 for connection to a load or an electrical receptacle. The electrical connections may be made at the time of assembly, or later during an upgrade/retrofit installation. The details of electrical connection will vary from power meter 300 to power meter. Connection of the power meter 300 across the electrical source and load will enable measurement of voltage. Connection in series adds the ability to measure current and phase angle, needed for additional information to be determined (and presented) by the power meter 300.

What is claimed is:

1. An assembly for enclosure within an electrical raceway, wherein the raceway includes an opening for receiving the assembly, comprising:

a plate, including an opening, wherein the plate is of a size and shape matching at least a portion of the opening in the raceway;

a power meter, wherein the power meter is affixed to the plate facing outward from the raceway opening and further wherein the opening in the plate approximates the size and shape of the power meter.

2. The assembly of claim 1, wherein the plate further includes at least two lips on a side of the plate facing towards the raceway, wherein the lips are perpendicular to a plane of the plate, and further wherein the lips are spaced apart at a distance approximating the size of the opening in the raceway, whereby the assembly may be affixed to the raceway.

3. The assembly of claim 2, wherein the lips are formed as one piece from the plate.

4. The assembly of claim 2, wherein the lips are angled pieces rigidly affixed to the plate.

* * * * *